US008927418B1

(12) United States Patent
Lin et al.

(10) Patent No.: US 8,927,418 B1
(45) Date of Patent: Jan. 6, 2015

(54) SYSTEMS AND METHODS FOR REDUCING CONTACT RESISTIVITY OF SEMICONDUCTOR DEVICES

(71) Applicant: Taiwan Semiconductor Manufacturing Company Limited, Hsinchu (TW)

(72) Inventors: Cheng-Tung Lin, Hsinchu County (TW); Teng-Chun Tsai, Hsinchu (TW); Li-Ting Wang, Tainan (TW); Chi-Yuan Chen, Hsinchu (TW); Hong-Mao Lee, Hsinchu (TW); Hui-Cheng Chang, Tainan (TW); Wei-Jung Lin, Taipei (TW); Bing-Hung Chen, New Taipei (TW); Chia-Han Lai, Hsinchu County (TW)

(73) Assignee: Taiwan Semiconductor Manufacturing Company Limited, Hsinchu Science Park, Hsinchu (TW)

( * ) Notice: Subject to any disclaimer, the term of this patent is extended or adjusted under 35 U.S.C. 154(b) by 0 days.

(21) Appl. No.: 13/945,422

(22) Filed: Jul. 18, 2013

(51) Int. Cl.
*H01L 21/4763* (2006.01)
*H01L 23/48* (2006.01)
*H01L 21/02* (2006.01)

(52) U.S. Cl.
CPC .......... *H01L 23/48* (2013.01); *H01L 21/02233* (2013.01)
USPC .......... 438/637; 257/734; 257/750; 257/773; 257/E23.138; 257/E21.045; 257/E21.036; 257/E21.159; 257/E21.16

(58) Field of Classification Search
USPC ................. 257/734, 750, 758, 760, 773, 774, 257/E23.138, E21.045, E21.046, E21.159, 257/E21.16; 438/637
See application file for complete search history.

(56) References Cited

U.S. PATENT DOCUMENTS

| 2002/0056923 A1* | 5/2002 | Wieczorek et al. ........... 257/782 |
| 2012/0222736 A1* | 9/2012 | Gee et al. ...................... 136/256 |

* cited by examiner

*Primary Examiner* — Jasmine Clark
(74) *Attorney, Agent, or Firm* — Jones Day

(57) ABSTRACT

Systems and methods are provided for reducing a contact resistivity associated with a semiconductor device structure. A substrate including a semiconductor region is provided. One or more dielectric layers are formed on the semiconductor region, the one or more dielectric layers including an element. A gaseous material is applied on the one or more dielectric layers to change a concentration of the element in the one or more dielectric layers. A contact layer is formed on the one or more dielectric layers to generate a semiconductor device structure. The semiconductor device structure includes the contact layer, the one or more dielectric layers, and the semiconductor region. A contact resistivity associated with the semiconductor device structure is reduced by changing the concentration of the element in the one or more dielectric layers.

20 Claims, 11 Drawing Sheets

SYSTEMS AND METHODS FOR REDUCING CONTACT RESISTIVITY OF SEMICONDUCTOR DEVICES

FIELD

The technology described in this patent document relates generally to semiconductor devices and more particularly to fabrication and characterization of semiconductor devices.

BACKGROUND

Integrated circuits (ICs) are often implemented by using a plurality of interconnected semiconductor devices, such as field effect transistors (FETs). More and more semiconductor devices are incorporated on a single IC chip with the development of the device fabrication technology, and thus the size of each device on the IC chip and the spacing between the devices (i.e., feature size) continue to decrease. The individual devices of the ICs, such as FETs and other passive and active circuit elements, are usually interconnected by metal or other conductors to implement desired circuit functions. A small contact resistance is associated with each contact between the conductor and the circuit element. As the feature size continues to decrease, the contact resistance associated with an individual circuit element often increases and becomes more important with respect to the total circuit resistance. In many circumstances, reducing the contact resistance of the devices may boost the performance of the ICs.

Gas cluster ion beam (GCIB) is often used in processing semiconductor devices. For example, in GCIB, gas phase atomic clusters containing thousands of atoms/molecules (e.g., $O_2$, $SiH_4$) are often created by supersonic expansion, and then weakly ionized. The ions accelerated to impact a substrate surface. A large amount of ions interact nearly simultaneously with the substrate atoms/molecules. Consequently, a large amount of energy is received in a relatively small volume near the substrate surface, which leads to extreme chemical and physical reactions at the substrate surface. However, individual ions in GCIB have low energy (e.g., a few eV) and thus, few ions can penetrate deeply into the substrate. For example, a pico-second temperature/pressure spike and thus infusion effects (e.g., melting) may occur within a distance of 2-20 nm from the substrate surface upon the impact of the ions in GCIB, while the bulk of the substrate remains at room temperature.

SUMMARY

In accordance with the teachings described herein, systems and methods are provided for reducing a contact resistivity associated with a semiconductor device structure. A substrate including a semiconductor region is provided. One or more dielectric layers are formed on the semiconductor region, the one or more dielectric layers including an element. A gaseous material is applied on the one or more dielectric layers to change a concentration of the element in the one or more dielectric layers. A contact layer is formed on the one or more dielectric layers to generate a semiconductor device structure. The semiconductor device structure includes the contact layer, the one or more dielectric layers, and the semiconductor region. A contact resistivity associated with the semiconductor device structure is reduced by changing the concentration of the element in the one or more dielectric layers.

In one embodiment, a method is provided for reducing a contact resistivity associated with a semiconductor device structure. A substrate including a semiconductor region is provided. A gaseous material is applied on the semiconductor region to form a first dielectric layer including an element. A pad layer is formed on the first dielectric layer Thermal annealing is performed on the pad layer and the first dielectric layer to form a second dielectric layer. A contact layer is formed on the second dielectric layer to generate a semiconductor device structure. The semiconductor device structure including the contact layer, the second dielectric layer, and the semiconductor region. A contact resistivity associated with the semiconductor device structure is reduced by changing a concentration of the element in the first dielectric layer.

In another embodiment, a semiconductor device structure includes a substrate, one or more dielectric layers, and a contact layer. The substrate includes a semiconductor region. The one or more dielectric layers are formed on the semiconductor region and include an element. A contact layer is formed on the one or more dielectric layers. A contact resistivity associated with the semiconductor device structure is reduced by changing a concentration of the element in the one or more dielectric layers by applying a gaseous material on the one or more dielectric layers.

In yet another embodiment, a semiconductor device structure includes a substrate, a first dielectric layer, and a contact layer. The substrate includes a semiconductor region. The first dielectric layer is formed by thermal annealing of a pad layer and a second dielectric layer. The second dielectric layer is formed by applying a gaseous material on the semiconductor region and includes an element. The contact layer is formed on the first dielectric layer. A contact resistivity associated with the semiconductor device structure is reduced by changing a concentration of the element in the second dielectric layer.

DETAILED DESCRIPTION

Figure 1:
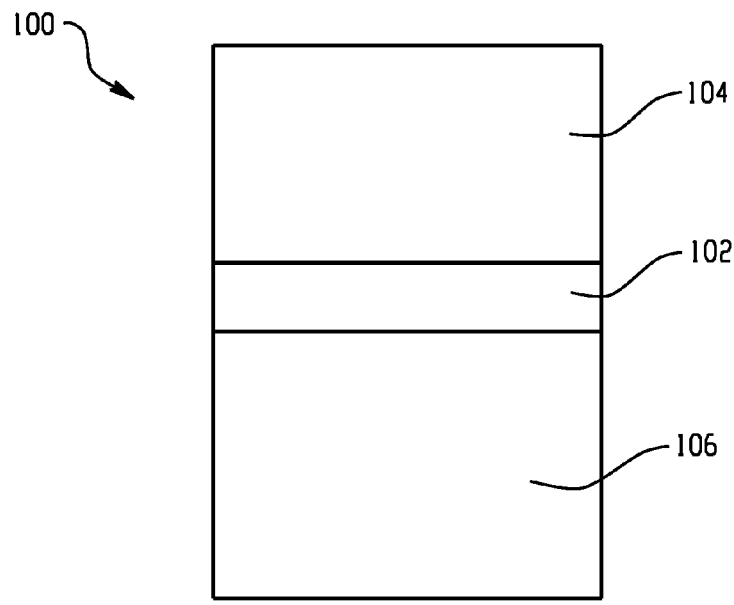
FIG. 1 depicts an example diagram for a metal-insulator-semiconductor structure.

In a metal-semiconductor contact, a Schottky barrier often exists between the metal and the semiconductor, and the height of the Schottky barrier represents a potential necessary for an electron to pass from the metal to the semiconductor. Usually, the contact resistivity may be reduced if the height of the Schottky barrier can be lowered. For example, as shown in FIG. 1, a metal-insulator-semiconductor (MIS) structure 100 may be implemented to reduce the contact resistivity. One or two thin insulator layers 102 (e.g., a $TiO_2$ layer) may be inserted between a contact layer 104 (e.g., a metal layer) and a semiconductor layer 106 (e.g., with N type doping or P type doping) to lower the height of the Schottky barrier between the metal and the semiconductor, e.g., by reducing Fermi-level pinning.

Figure 2:
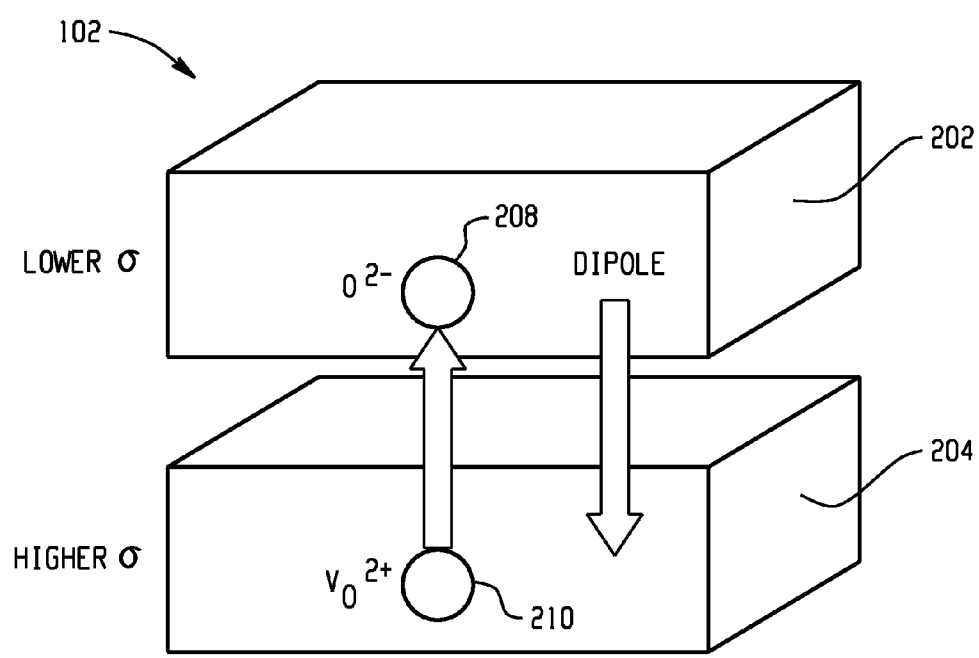
FIG. 2 depicts an example diagram for two insulator layers with interface dipole effects.

When two insulator layers are placed next to each other, dipole effects may occur at the interface between two insulator layers. For example, as shown in FIG. 2, two oxide layers 202 and 204 are stacked together. The oxide layer 202 has a lower areal density of oxygen atoms (i.e., a lower σ), compared with the oxide layer 204. The difference in the areal density of oxygen atoms between the two oxide layers 202 and 204 may be compensated by oxygen atoms transferring in a form of $O^{2-}$ (e.g., the ion 208) from the oxide layer 204 to the oxide layer 202, leaving behind oxygen vacancies in the oxide layer 204 in a form of $V_O^{2+}$ (e.g., the vacancy 210), which results in an interface dipole effect.

Referring back to FIG. 1, the interfacial insulator layers 102 may include an oxide layer (e.g., a $TiO_2$ layer) that, upon formation, has a particular concentration of oxygen. Such a concentration of oxygen in the oxide layer affects the contact resistivity associated with the MIS structure 100. However, once the contact layer 104 is deposited on the insulator layers 102, it may be difficult to adjust the concentration of oxygen in the insulator layers 102 so as to reduce the contact resistivity.

Figure 3A:
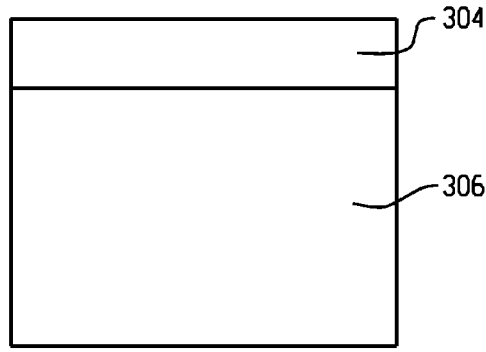
FIGS. 3A-3C depict example diagrams for reducing contact resistivity of a MIS structure using gas cluster treatment on dielectric layers.
Figure 3B:
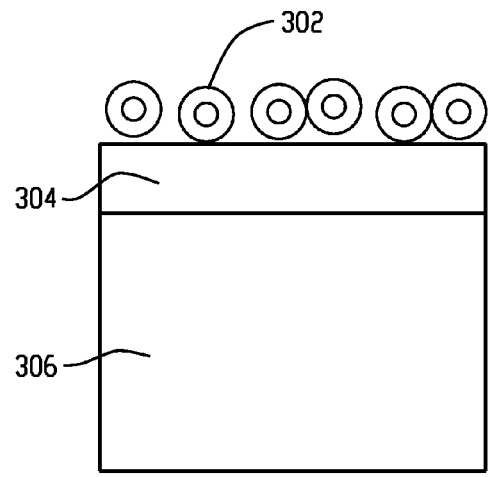
Figure 3C:
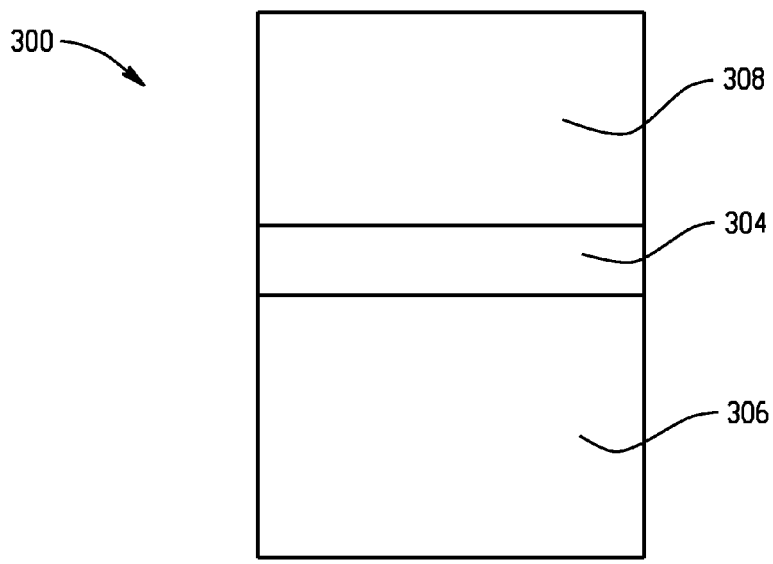

FIGS. 3A-3C depict example diagrams for reducing contact resistivity of a MIS structure using gas cluster treatment on dielectric layers. A gas cluster ion beam 302 may be implemented to adjust a concentration of one or more elements (e.g., oxygen) in one or more dielectric layers 304 that are formed on a semiconductor layer 306 to reduce contact resistivity of a MIS structure 300.

Specifically, as shown in FIG. 3A, the dielectric layers 304 may be formed on the semiconductor layer 306. The dielectric layers 304 may include a single dielectric layer (e.g., a $TiO_x$ layer), two dielectric layers (e.g., a TiO, layer and a $SiO_2$ layer), or multiple dielectric layers. As shown in FIG. 3B, the GCIB 302 interacts with atoms/molecules of the dielectric layers 304 to change the concentration of one or more elements (e.g., oxygen) in the dielectric layers 304. A contact layer 308 may be formed on the dielectric layers 304 to generate the MIS structure 300 of which the contact resistivity has been improved by tuning the concentration of one or more elements in the dielectric layers 304, e.g., through properly choosing parameters of the GCIB 302, as shown in FIG. 3C. For example, both the energy and the dose of the GCIB 302 may be adjusted for improving the contact resistivity. As an example, the contact layer 308 may include a glue layer (e.g., Ti/TiN) and a metal layer (e.g., W, Al, Cu).

Figure 4A:
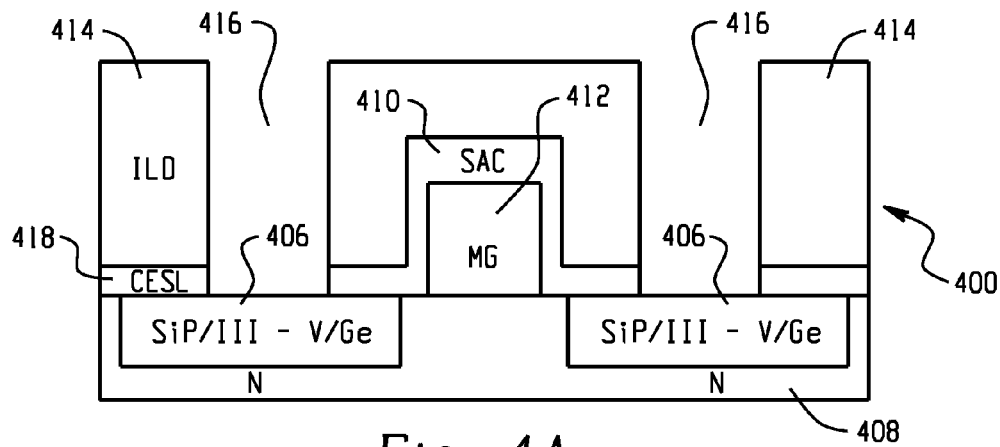
FIGS. 4A-4C depict example diagrams for reducing contact resistivity of N-channel transistor structures using gas cluster treatment on a dielectric layer.
Figure 4B:
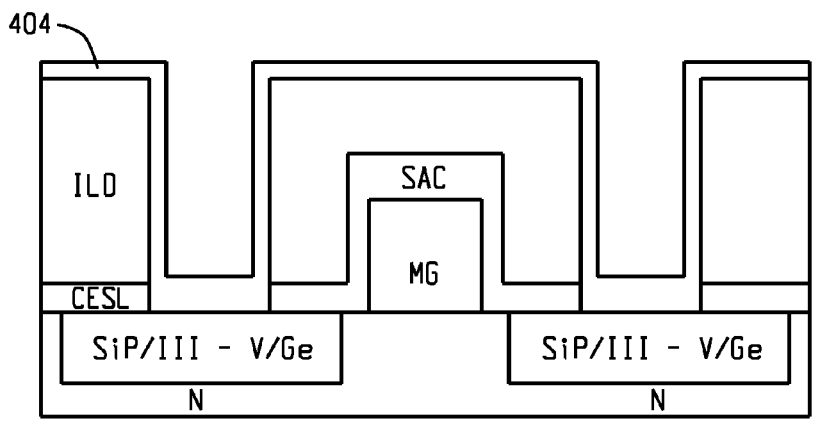
Figure 4C:
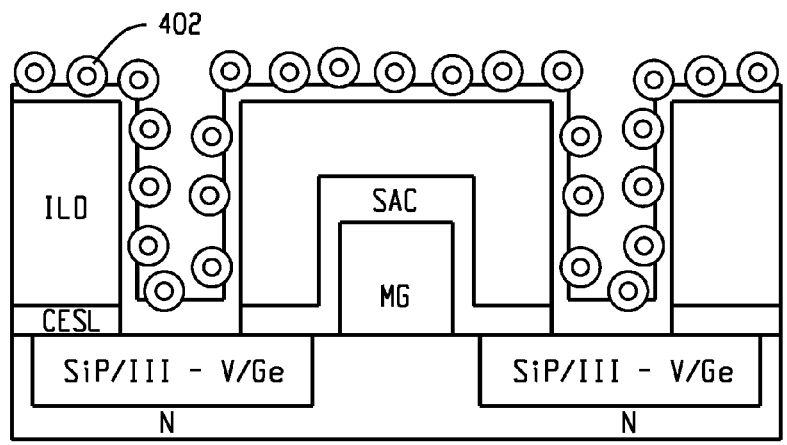

FIGS. 4A-4C depict example diagrams for reducing contact resistivity of N-channel transistor structures using gas cluster treatment on a dielectric layer. A GCIB 402 may be implemented to adjust an oxygen concentration in a dielectric layer 404 that is formed on source/drain regions 406 of an N-channel transistor structure 400 to reduce contact resistivity.

Particularly, as shown in FIG. 4A, the N-channel transistor structure 400 may be built on a substrate 408 (e.g., a silicon substrate, a silicon-on-insulator substrate, a germanium-based substrate, or a III-V material substrate). A sacrificial oxide 410 (SAC) substantially covers a metal gate region 412 (MG) of the N-channel transistor structure 400. An interlayer dielectric layer 414 (ILD) may be disposed over the N-channel transistor structure 400. Contact openings 416 are formed by etching through the interlayer dielectric layer 414 and a contact etch stop layer 418 (CESL) over the source/drain regions 406.

As shown in FIG. 4B, the dielectric layer 404 (e.g., a $TiO_2$ layer) is formed on the N-channel transistor structure 400, e.g., through physical vapor deposition (PVD), chemical vapor deposition (CVD), or atomic layer deposition (ALD). For example, a layer of titanium is deposited on the N-channel transistor structure 400, and then oxidized to form the dielectric layer 404. The GCIB 402 is then applied to change the oxygen concentration in the dielectric layer 404, as shown in FIG. 4C. For example, the GCIB 402 may include a large number of gas clusters (about 10~about 10000) and have an energy range of about 3 kV~about 100 kV. The size of the gas cluster may be within a range of about 1 nm~about 1000 nm. The oxygen dose in the gas clusters may be within a range of about $10^{11}$~$10^{16}$. A contact layer including a glue layer (e.g., Ti/TiN) and a metal layer (e.g., W, Al, Cu) may be deposited on the dielectric layer 404 and undergo a chemical-mechanical processing (CMP). As an example, a low temperature annealing may be performed after the gas cluster treatment. In one example, the source/drain regions 406 may include SiP, III-V materials and/or Ge.

FIGS. 5A-5D depict example diagrams for reducing contact resistivity of P-channel transistor structures using gas cluster treatment on dielectric layers. Two dielectric layers 602 and 604 are formed consecutively on a source/drain region 606 of a P-channel transistor structure, and a GCIB 608 is implemented to adjust a concentration of one or more elements (e.g., oxygen) in the dielectric layers 602 and 604 to reduce contact resistivity.

Figure 5A:
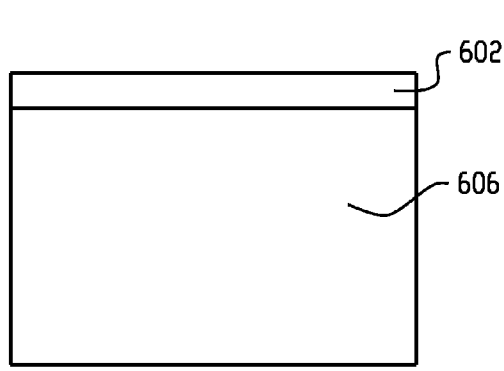
FIGS. 5A-5D depict example diagrams for reducing contact resistivity of P-channel transistor structures using gas cluster treatment on dielectric layers.
Figure 5B:
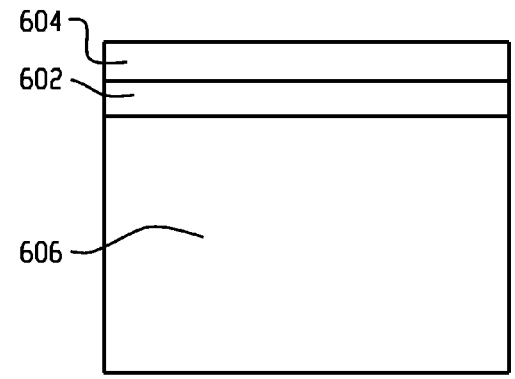
Figure 5C:
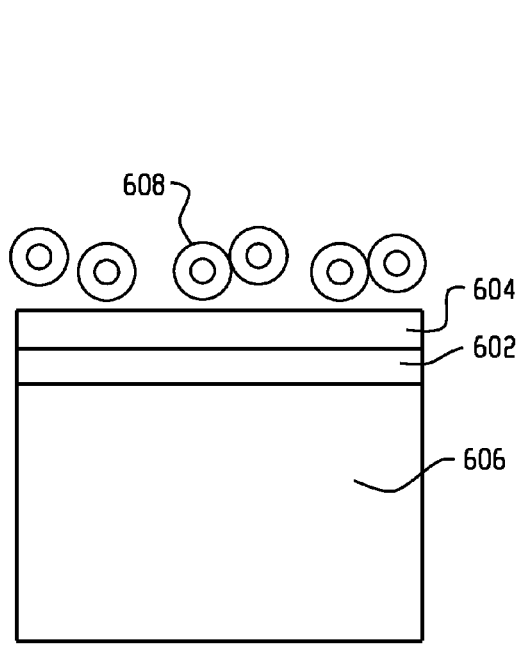
Figure 5D:
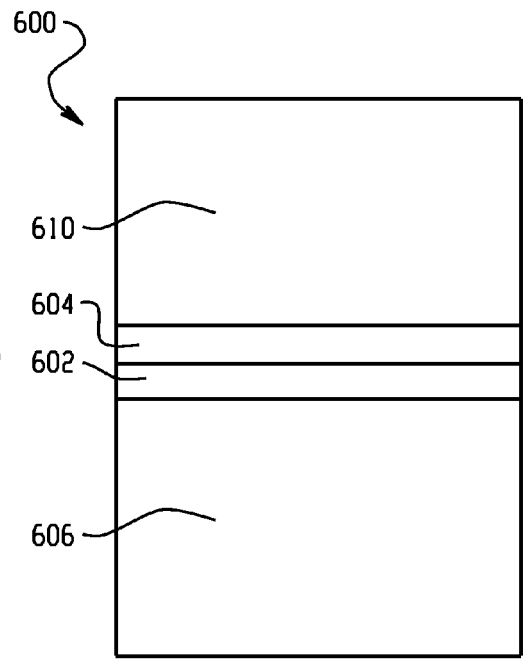

Specifically, as shown in FIG. 5A, the dielectric layer 602 (e.g., a SiO2 layer) is formed on the source/drain region 606, e.g., through PVD, CVD or ALD. Then, the dielectric layer 604 (e.g., a $TiO_2$ layer) is formed on top of the dielectric layer 602, as shown in FIG. 5B. Dipoles may form at the interface between the dielectric layers 602 and 604. For example, as shown in FIG. 5C, the GCIB 608 interacts with atoms/molecules of the dielectric layer 604 to change the concentration of one or more elements (e.g., oxygen) in the dielectric layers 604 and thus change the magnitude of the interface dipoles between the dielectric layers 602 and 604 in order to reduce the contact resistivity. As shown in FIG. 5D, a contact layer 610 is then formed on the dielectric layer 604 to generate the MIS structure 600 of which the contact resistivity has been improved by tuning the magnitude of the interface dipoles between the dielectric layers 602 and 604 through the GCIB 608. For example, the source/drain region 606 includes SiGe and/or Ge.

Figure 6A:
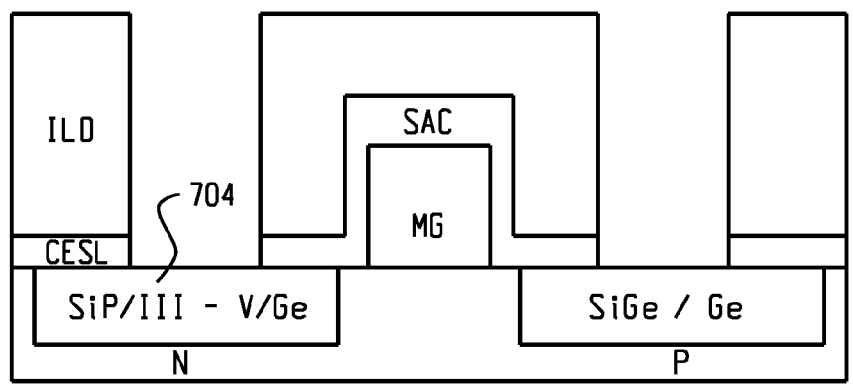
FIGS. 6A-6E depict example diagrams for reducing contact resistivity of both N-channel transistor structures and P-channel transistor structures using gas cluster treatment on dielectric layers.
Figure 6B:
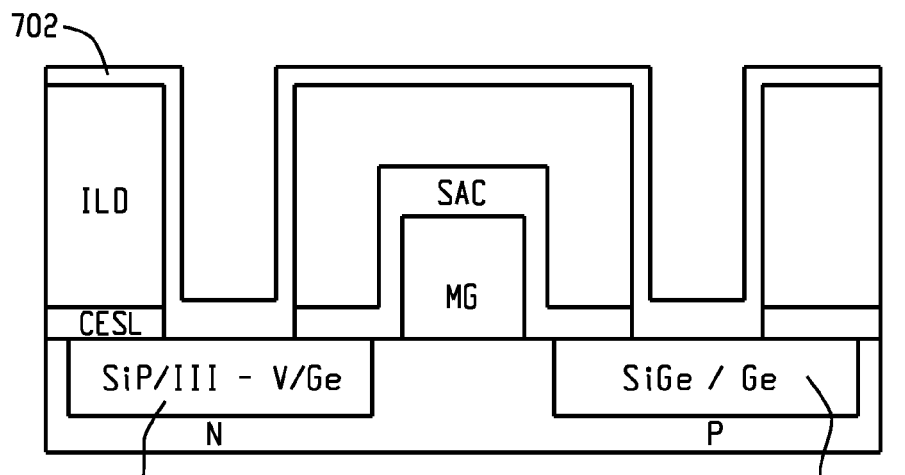
Figure 6C:
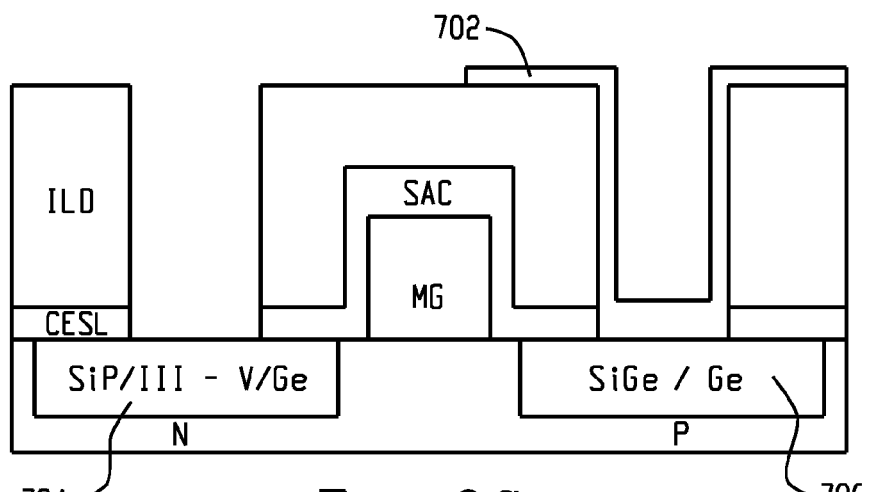
Figure 6D:
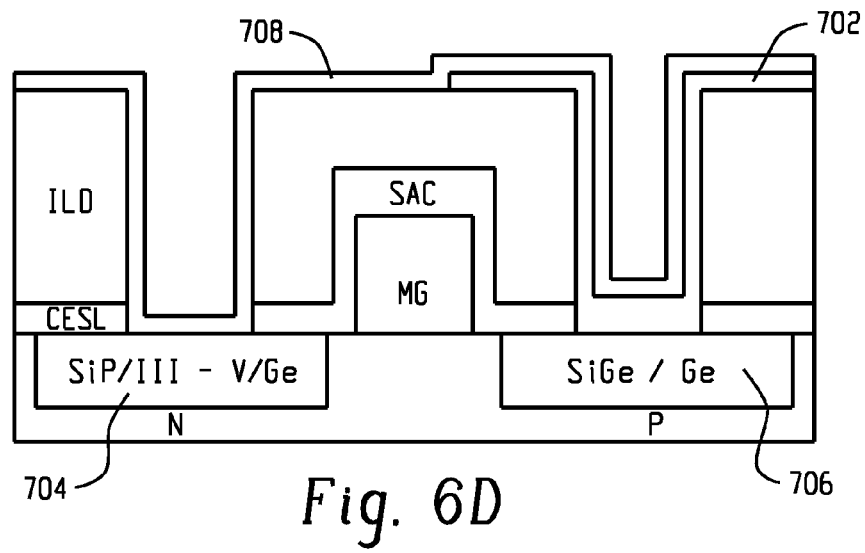
Figure 6E:
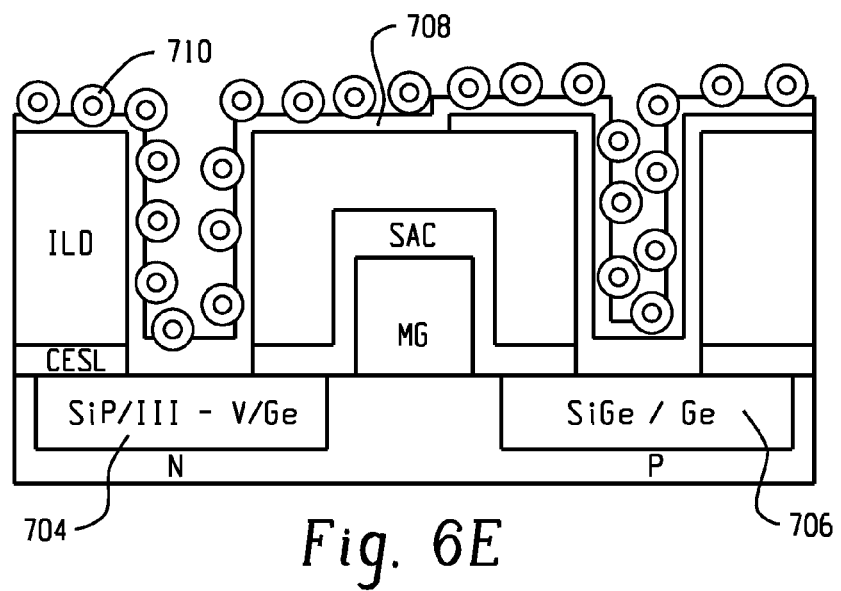

FIGS. 6A-6E depict example diagrams for reducing contact resistivity of both N-channel transistor structures and P-channel transistor structures using gas cluster treatment on dielectric layers. As shown in FIG. 6B, a dielectric layer 702 is formed on both a source/drain region 704 of a N-channel transistor structure and a source/drain region 706 of a P-channel transistor structure. Then, the dielectric layer 702 is substantially removed from the source/drain region 704, as shown in FIG. 6C. Another dielectric layer 708 is formed on both the source/drain region 704 and the source/drain region 706, as shown in FIG. 6D. A GCIB 710 is implemented to adjust an oxygen concentration in the dielectric layer 708 to reduce contact resistivity, as shown in FIG. 6E. A contact layer including a glue layer (e.g., Ti/TiN) and a metal layer (e.g., W, Al, Cu) may be deposited on the dielectric layer 708. As an example, a low temperature annealing may be performed after the gas cluster treatment.

Figure 7:
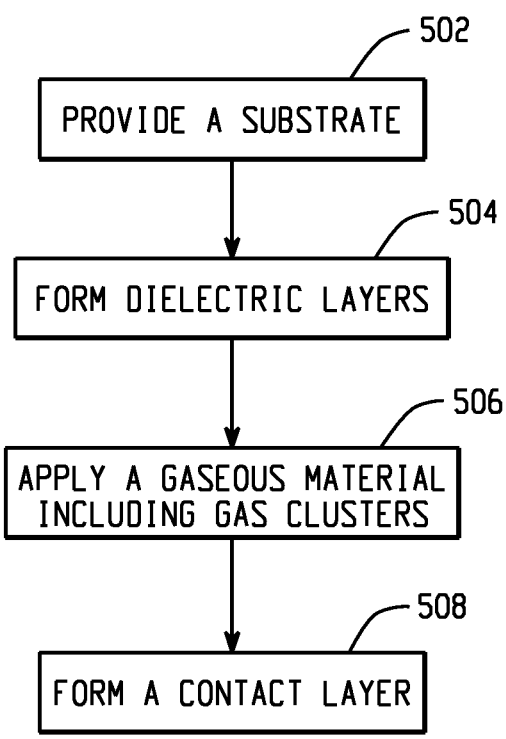
FIG. 7 depicts an example flow chart for reducing contact resistivity of a semiconductor device structure.

FIG. 7 depicts an example flow chart for reducing contact resistivity of a semiconductor device structure. As shown in FIG. 7, at 502, a substrate including a semiconductor region is provided. At 504, one or more dielectric layers are formed on the semiconductor region. The one or more dielectric layers include an element. At 506, a gaseous material is applied (e.g., through a GCIB) on the one or more dielectric layers to change a concentration of the element in the one or more dielectric layers. At 508, a contact layer is formed on the one or more dielectric layers to generate a semiconductor device structure. The semiconductor device structure includes the contact layer, the one or more dielectric layers, and the semiconductor region. A contact resistivity associated with the semiconductor device structure is reduced by changing the concentration of the element in the one or more dielectric layers.

FIGS. 8A-8E depict example diagrams for reducing contact resistivity of a MIS structure using gas cluster treatment on a substrate. A thin dielectric layer 806 is formed by applying a GCIB 802 on a substrate 804, and a concentration of one or more elements in the dielectric layer 806 may be adjusted to reduce contact resistivity.

Figure 8A:
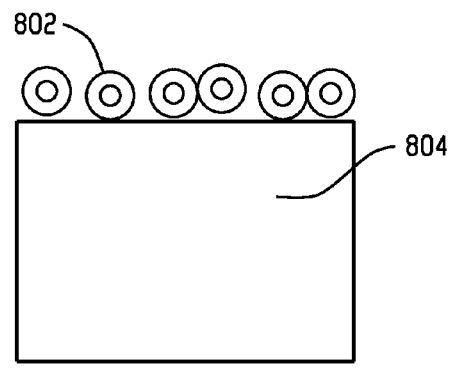
FIGS. 8A-8E depict example diagrams for reducing contact resistivity of a MIS structure using gas cluster treatment on a substrate.
Figure 8B:
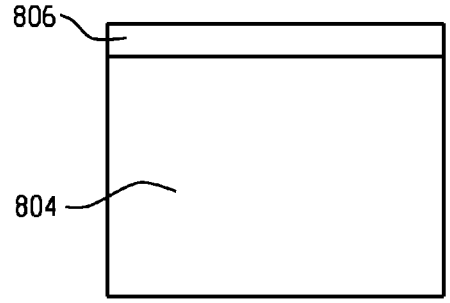
Figure 8C:
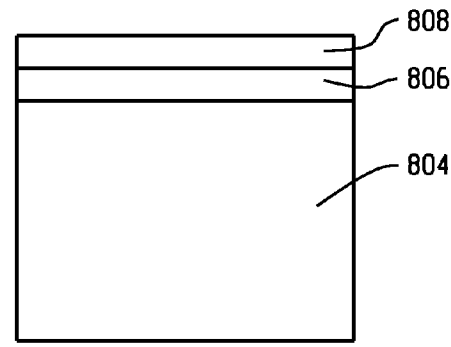
Figure 8D:
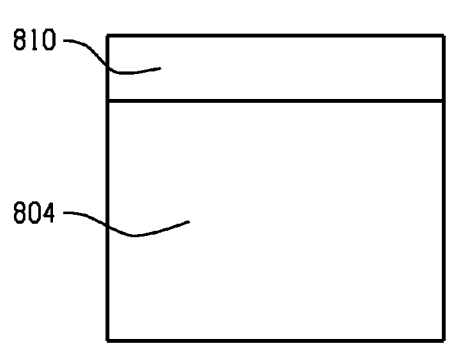
Figure 8E:
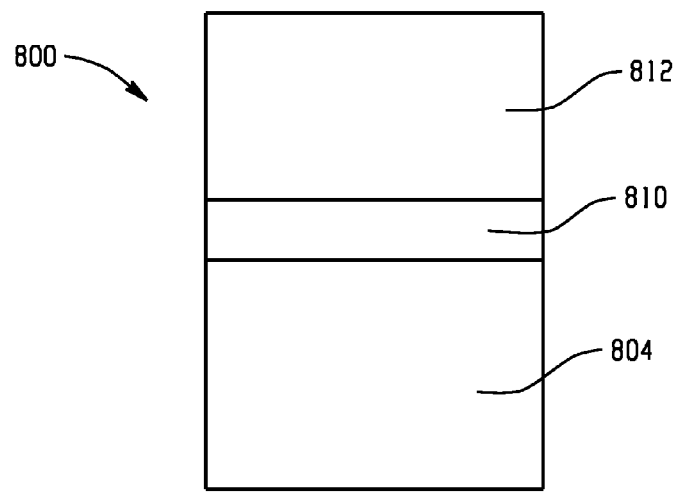

As shown in FIGS. 8A and 8B, the GCIB 802 is may be applied on the substrate 804 to form the thin dielectric layer 806 (e.g., an oxide layer). A pad layer 808 is formed on the dielectric layer 806, as shown in FIG. 8C. Another dielectric layer 810 is generated through thermal annealing of the pad layer 808 and the dielectric layer 806, as shown in FIG. 8D. A contact layer 812 is formed on the dielectric layer 810 to generate a MIS structure 800, as shown in FIG. 8E. As the dielectric layer 806 is formed by applying the GCIB 802 on the substrate 804, the contact resistivity of the MIS structure 800 may be reduced by adjusting a concentration of one or more elements (e.g., oxygen) in the dielectric layer 806, e.g., through properly choosing parameters of the GCIB 802.

Figure 9A:
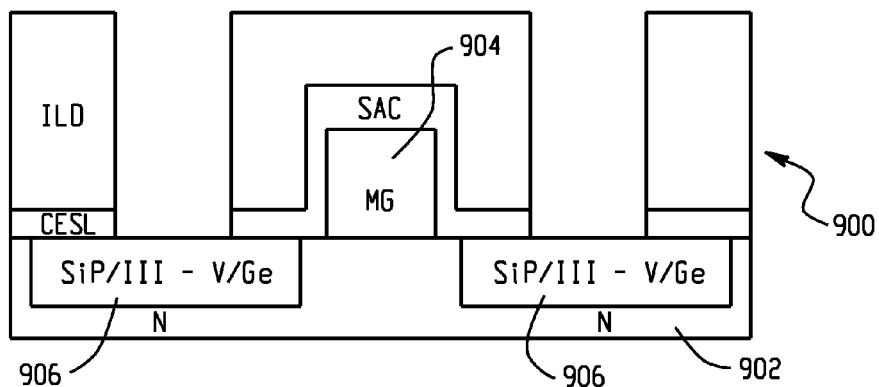
FIGS. 9A-9D depict example diagrams for reducing contact resistivity of N-channel transistor structures using gas cluster treatment on a substrate.
Figure 9B:
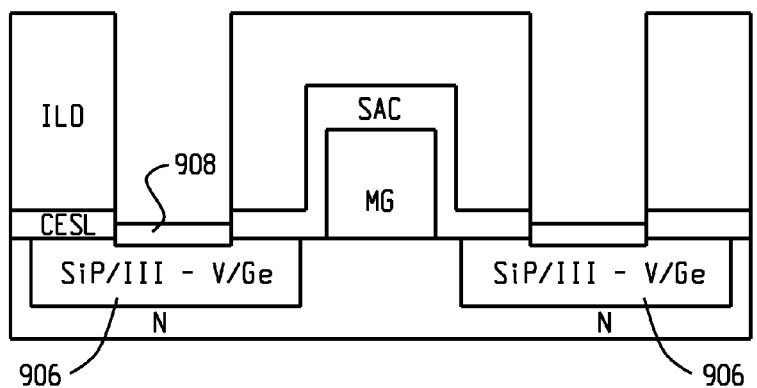

FIGS. 9A-9D depict example diagrams for reducing contact resistivity of N-channel transistor structures using gas cluster treatment on a substrate. As shown in FIG. 9A, the N-channel transistor structure 900 built on a substrate 902 includes a metal gate region 904 (MG) and source/drain regions 906. As shown in FIG. 9B, the thin dielectric layer 908 (e.g., a $SiO_2$ layer) is formed on the N-channel transistor structure 900 by applying a GCIB directly on the source/drain regions 906 in the substrate 902. For example, the source/drain regions 906 are oxidized by the GCIB.

Figure 9C:
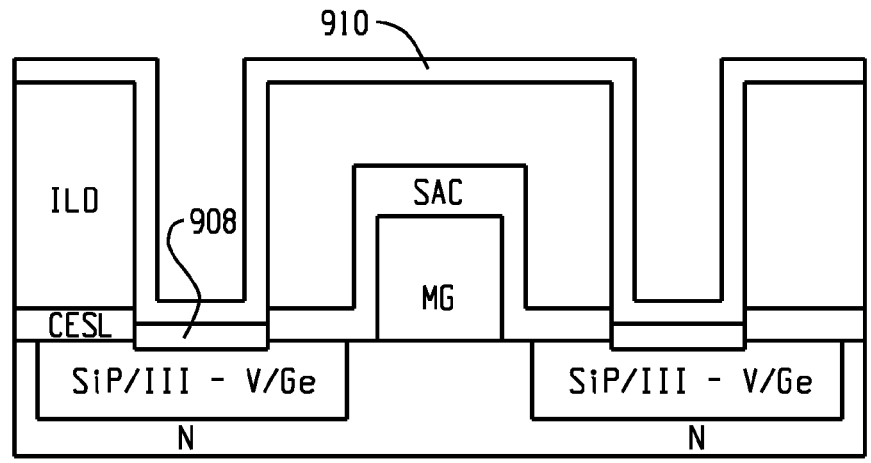
Figure 9D:
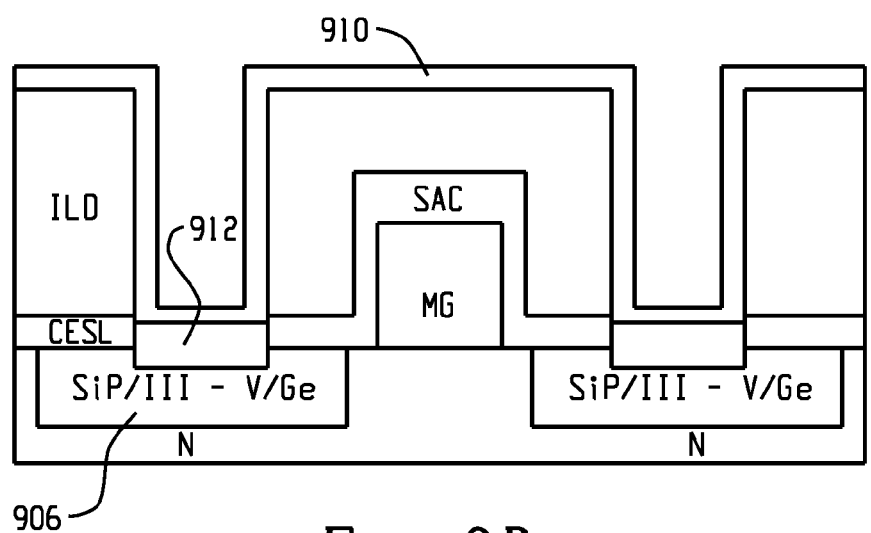

As shown in FIG. 9C, a pad layer 910 (e.g., a Ti/TiN layer) is formed over the N-channel transistor structure 900, including the dielectric layer 908. Thermal annealing may be performed so that another dielectric layer 912 (e.g., a $TiO_2$ layer) is generated from the pad layer 910 and the dielectric layer 908, as shown in FIG. 9D. A contact layer may be deposited on the dielectric layer 912, and the contact resistivity of the N-channel transistor structure 900 may be optimized, e.g., by properly choosing the energy and dose of the GCIB. For example, the thickness of the pad layer 910 is in a range of about 0.5 nm~about 25 nm. As an example, the thermal annealing may be performed using millisecond annealing (e.g., at about 500° C.~about 1200° C.) or rapid thermal annealing (e.g., at about 300° C.~about 1000° C. for about 0.01 second~about 10 seconds).

Figure 10:
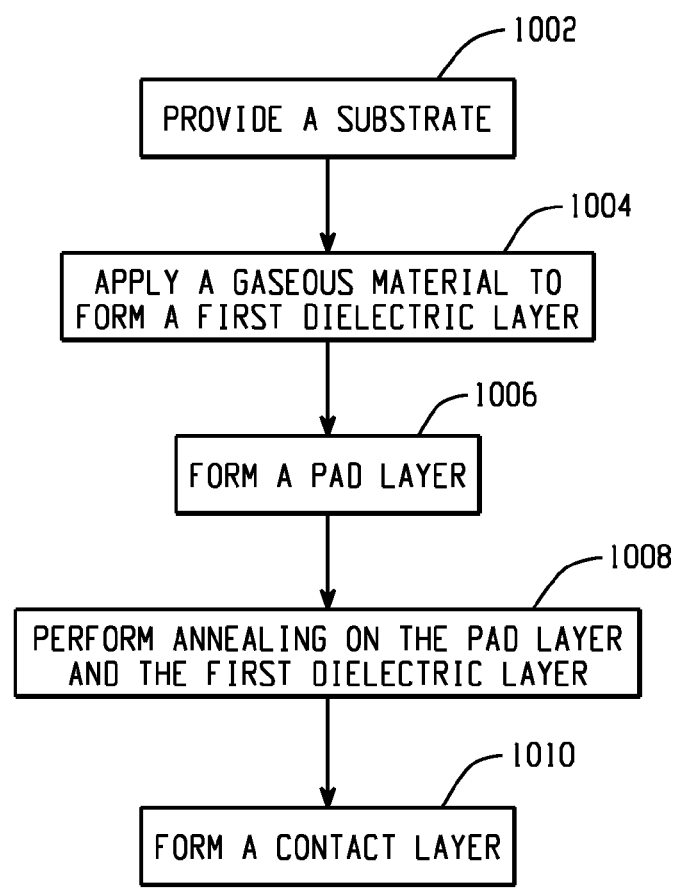
FIG. 10 depicts another example flow chart for reducing contact resistivity of a semiconductor device structure.

FIG. 10 depicts another example flow chart for reducing contact resistivity of a semiconductor device structure. At 1002, a substrate including a semiconductor region is provided. At 1004, a gaseous material is applied on the semiconductor region to form a first dielectric layer including an element. At 1006, a pad layer is formed on the first dielectric layer. At 1008, thermal annealing is performed on the pad layer and the first dielectric layer to form a second dielectric layer. At 1010, a contact layer is formed on the second dielectric layer to generate a semiconductor device structure. The semiconductor device structure includes the contact layer, the second dielectric layer, and the semiconductor region. A contact resistivity associated with the semiconductor device structure is reduced by changing a concentration of the element in the first dielectric layer.

This written description uses examples to disclose the invention, include the best mode, and also to enable a person skilled in the art to make and use the invention. The patentable scope of the invention may include other examples that occur to those skilled in the art. One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the art will recognize various equivalent combinations and substitutions for various components shown in the figures.

What is claimed is:

1. A method for reducing a contact resistivity associated with a semiconductor device structure, the method comprising:

providing a substrate including a semiconductor region;

forming one or more dielectric layers on the semiconductor region, the one or more dielectric layers including an element;

applying a gaseous material on the one or more dielectric layers to change a concentration of the element in the one or more dielectric layers; and forming a contact layer on the one or more dielectric layers to generate a semiconductor device structure, the semiconductor device structure including the contact layer, the one or more dielectric layers, and the semiconductor region;

wherein a contact resistivity associated with the semiconductor device structure is reduced by changing the concentration of the element in the one or more dielectric layers.

2. The method of claim 1, wherein the element includes oxygen.

3. The method of claim 1, wherein the one or more dielectric layers include a first oxide layer.

4. The method of claim 3, wherein:
the substrate includes a transistor having a source region and a drain region; and
the semiconductor region corresponds to the source region or the drain region.

5. The method of claim 4, wherein the transistor includes a N-channel field effect transistor.

6. The method of claim 4, wherein the one or more dielectric layers further include a second oxide layer.

7. The method of claim 6, wherein the transistor includes a P-channel field effect transistor.

8. The method of claim 6, wherein the gaseous material is applied to increase an interface-dipole magnitude between the first oxide layer and the second oxide layer.

9. The method of claim 1, wherein the gaseous material is applied using a gas cluster ion beam.

10. The method of claim 9, wherein the gas cluster ion beam includes one or more oxygen gas clusters.

11. A method for reducing a contact resistivity associated with a semiconductor device structure, the method comprising:
providing a substrate including a semiconductor region;
applying a gaseous material on the semiconductor region to form a first dielectric layer including an element;
forming a pad layer on the first dielectric layer;
perform thermal annealing on the pad layer and the first dielectric layer to form a second dielectric layer; and
forming a contact layer on the second dielectric layer to generate a semiconductor device structure, the semiconductor device structure including the contact layer, the second dielectric layer, and the semiconductor region;
wherein a contact resistivity associated with the semiconductor device structure is reduced by changing a concentration of the element in the first dielectric layer.

12. The method of claim 11, wherein the gaseous material is applied using a gas cluster ion beam.

13. The method of claim 12, wherein the gas cluster ion beam includes one or more oxygen gas clusters.

14. The method of claim 11, wherein the pad layer includes a metal layer.

15. The method of claim 14, wherein the second dielectric layer includes a metal oxide generated from the metal layer.

16. The method of claim 11, wherein the element includes oxygen.

17. A semiconductor device structure comprising:
a substrate including a semiconductor region;
one or more dielectric layers formed on the semiconductor region, the one or more dielectric layers including an element; and
a contact layer formed on the one or more dielectric layers;
wherein a contact resistivity associated with the semiconductor device structure is reduced by changing a concentration of the element in the one or more dielectric layers by applying a gaseous material on the one or more dielectric layers.

18. The semiconductor device structure of claim 17, wherein the element includes oxygen.

19. A semiconductor device structure comprising:
a substrate including a semiconductor region;
a first dielectric layer formed by thermal annealing of a pad layer and a second dielectric layer, the second dielectric layer being formed by applying a gaseous material on the semiconductor region, the second dielectric layer including an element; and
a contact layer formed on the first dielectric layer;
wherein a contact resistivity associated with the semiconductor device structure is reduced by changing a concentration of the element in the second dielectric layer.

20. The semiconductor device structure of claim 19, wherein the element includes oxygen.

* * * * *